United States Patent
Krueger-Moll et al.

(10) Patent No.: US 12,342,463 B2
(45) Date of Patent: Jun. 24, 2025

(54) PRINTED CIRCUIT BOARD ARRANGEMENT

(71) Applicant: Rohde & Schwarz GmbH & Co. KG, Munich (DE)

(72) Inventors: Rene Krueger-Moll, Dresden (DE); Joerg Reins, Dresden (DE); Rafal Przeslawski, Dresden (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 224 days.

(21) Appl. No.: 18/359,119

(22) Filed: Jul. 26, 2023

(65) Prior Publication Data

US 2025/0040050 A1 Jan. 30, 2025

(51) Int. Cl.
*H05K 1/14* (2006.01)
*H05K 1/02* (2006.01)

(52) U.S. Cl.
CPC .......... *H05K 1/144* (2013.01); *H05K 1/0203* (2013.01); *H05K 2201/042* (2013.01)

(58) Field of Classification Search
CPC . H05K 1/144; H05K 1/0203; H05K 2201/042
See application file for complete search history.

(56) References Cited

U.S. PATENT DOCUMENTS

| | | | |
|---|---|---|---|
| 8,259,483 B1* | 9/2012 | Ayers | G11C 5/063 365/185.11 |
| 2020/0373260 A1* | 11/2020 | Hovis | H05K 1/141 |

OTHER PUBLICATIONS

Altera; "Thermal Management for FPGAs"; AN-358-4.0 Application Note; Altera Corporation; Mar. 2012; pp. 1-15.

* cited by examiner

*Primary Examiner* — Sherman Ng
(74) *Attorney, Agent, or Firm* — Studebaker Brackett PLLC

(57) ABSTRACT

Disclosed is a printed circuit board, PCB, arrangement, comprising a first PCB comprising a digital integrated circuit, IC; a second PCB, comprising a power supply circuitry for the digital IC; and a plurality of electrically conductive spacers, being mechanically interposed between the first PCB and the second PCB, and electrically interposed between the power supply circuitry and the digital IC. This avoids the issues due to the increase in power density as well as integration level in cutting edge processor architecture.

13 Claims, 1 Drawing Sheet

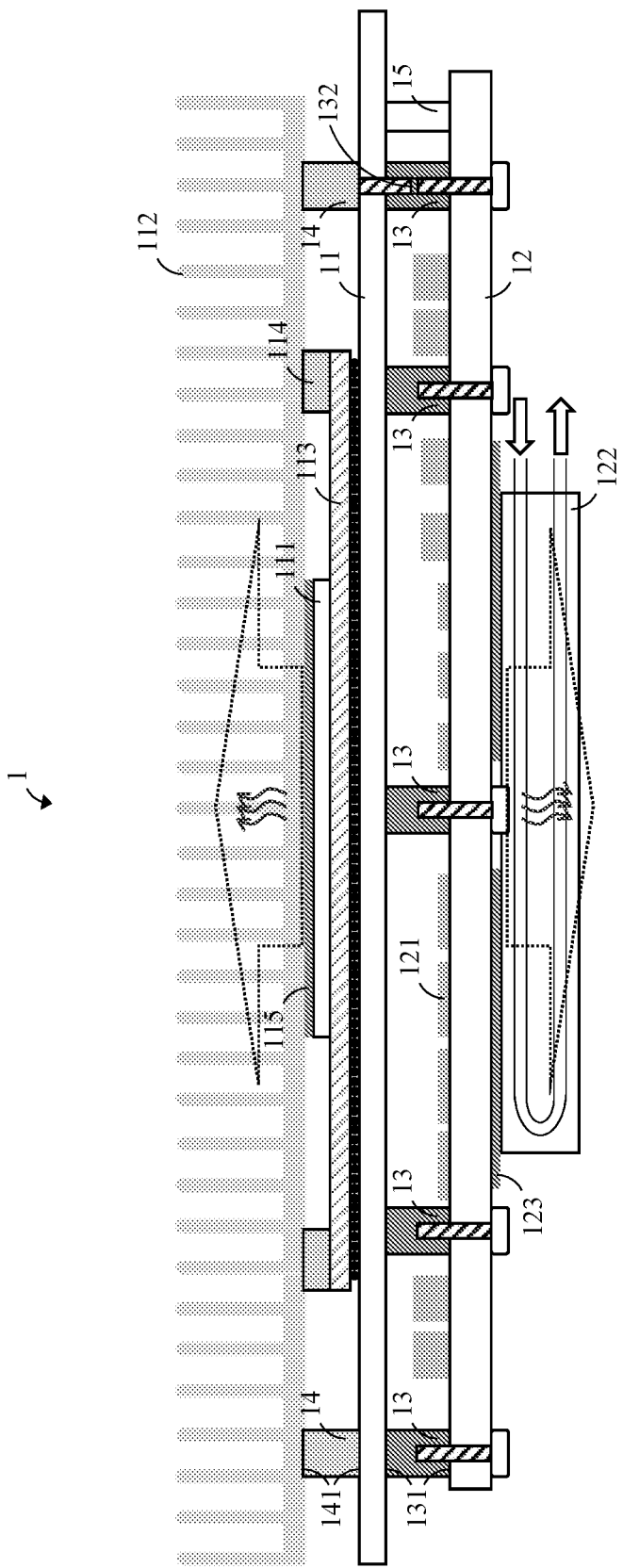

PRINTED CIRCUIT BOARD ARRANGEMENT

TECHNICAL FIELD

The present disclosure relates generally to design of printed electronic circuits and particularly to a printed circuit board (PCB) arrangement.

BACKGROUND ART

Every level of increase in power density as well as integration level in cutting edge processor architecture makes smart implementation on board level more and more difficult. Due to increasing number of signals, voltage rails and package dimensions, a fan-out area for signal dissolution increases equally. In addition, board stack-up and layout requirements for high-speed signal routing and high-power delivery are opposed by nature.

SUMMARY

It is an object to overcome the above-mentioned and other drawbacks by a functional board split-up into digital board and power supply board.

The foregoing and other objects are achieved by the features of the independent claim. Further implementation forms are apparent from the dependent claims, the description and the FIGURES.

According to a first aspect, a printed circuit board, PCB, arrangement is provided, comprising a first PCB comprising a digital integrated circuit, IC; a second PCB, comprising a power supply circuitry for the digital IC; and a plurality of electrically conductive spacers, being mechanically interposed between the first PCB and the second PCB, and electrically interposed between the power supply circuitry and the digital IC.

Each of the spacers may comprise a pair of parallel faces facing away from one another.

The parallel faces may be spaced in excess of a largest component height of the power supply circuitry.

At least one of the spacers may be screwed to the second PCB via a threaded blind or through hole extending perpendicularly to the parallel faces.

At least one of the spacers may be soldered to the first PCB via one of the parallel faces.

At least one of the spacers may be at a ground electric potential.

At least one of the spacers may be at a ground-referenced electric potential corresponding to a nominal supply voltage of the digital IC.

The power supply circuitry may comprise a ground-referenced electric potential in excess of the nominal supply voltage of the digital IC.

The PCB arrangement may further comprise a first heat sink, heat spreader or cold plate being in thermodynamic communication with a component package of the power supply circuitry, wherein the power supply circuitry is arranged on a surface of the second PCB facing away from the first PCB.

The PCB arrangement may further comprise a second heat sink, heat spreader or cold plate being in thermodynamic communication with a component package of the digital IC, wherein the digital IC is arranged on a surface of the first PCB facing away from the second PCB.

The PCB arrangement may further comprise a plurality of mounting terminals for the second heat sink, heat spreader or cold plate on the surface of the first PCB facing away from the second PCB.

Each of the mounting terminals may comprise a pair of parallel faces facing away from one another.

At least one of the mounting terminals may be screwed to the first PCB via one of its parallel faces in alignment with at least one of the spacers.

At least one of the mounting terminals may be soldered to the first PCB via one of its parallel faces in alignment with at least one of the spacers.

The digital IC may comprise one or more of: a field-programmable gate array, FPGA, an application-specific integrated circuit, ASIC, and a central processing unit, CPU.

Advantageous Effects

The present disclosure proposes a functional board split-up into digital board (carrying a digital IC such as an FPGA, ASIC or CPU) and power supply board (mainly for core power delivery) as shown in the example of FIG. 1.

Thereby the following advantages can be achieved:

Thicker copper layers for increased ampacity (i.e., ampere capacity, representing a maximum current in amperes that a conductor can carry continuously under the conditions of use without exceeding its temperature rating) and decrease power drop vice versa Reduced power handling at the digital board over longer distances (between power source and point of load)

Originally separated mounting bracket for PCB stabilizing purposes as well as heat spreader assembly can be replaced by the power board Increased space for optimizing signal fan-out on digital board Easier and safer in terms of assembly, testing and yield Simpler way to spin core power domain circuitries in case of new technology introduction or even end-of-life (EOL) situations

BRIEF DESCRIPTION OF DRAWINGS

The above-described aspects and implementations will now be explained with reference to the accompanying drawings, in which the same or similar reference numerals designate the same or similar elements.

The features of these aspects and implementations may be combined with each other unless specifically stated otherwise.

The drawings are to be regarded as being schematic representations, and elements illustrated in the drawings are not necessarily shown to scale. Rather, the various elements are represented such that their function and general purpose become apparent to those skilled in the art.

FIG. 1 illustrates a PCB arrangement in accordance with the present disclosure.

DETAILED DESCRIPTIONS OF DRAWINGS

FIG. 1 illustrates a printed circuit board (PCB) arrangement 1 in accordance with the present disclosure.

A printed circuit board or PCB as used herein may refer to a plate-shaped electric isolator used to connect electronic components to one another via conductor tracks extending within one or more parallel conductor layers.

The PCB arrangement 1 comprises a first PCB 11, a second PCB 12, and a plurality of electrically conductive spacers 13.

The plurality of electrically conductive spacers 13 is mechanically interposed between the first PCB 11 and the second PCB 12. For example, the spacers 13 may have a cylindric shape and be made of copper (for good electrical and thermal conductivity).

The spacers 13 should be evenly distributed to the PCB surface below the digital IC 111 to stabilize the first PCB 11 in the best way, but can be adjusted according to actual PCB floor planning.

The first PCB 11 comprises a digital integrated circuit (IC) 111.

An integrated circuit or IC as used herein may refer to a plurality of electronic circuits integrated on a small flat piece (or "chip") of semiconductor material.

In particular, the digital IC 111 may comprise one or more of: a field-programmable gate array (FPGA), an application-specific integrated circuit (ASIC), and a central processing unit (CPU).

In the example of FIG. 1, the digital IC 111 is electrically and mechanically attached to the first PCB 11 via a ball grid array (BGA) package 113. Note that other types of surface-mount packaging such as dual in-line (DIL) package or quad flat package (QFP) are also possible.

A ball grid array or BGA package as used herein may refer to a type of surface-mount packaging of an IC via a grid array of solder balls on a bottom face of said IC.

The second PCB 12 comprises a power supply circuitry 121 for the digital IC 111.

For example, the power supply circuitry 121 may comprise a DC/DC converter (not shown), such as a step-down/buck converter.

The plurality of electrically conductive spacers 13 is also electrically interposed between the power supply circuitry 121 and the digital IC 111.

Each of the spacers 13 may comprise a pair of parallel faces 131 facing away from one another. This enables a parallel arrangement of the first PCB 11 and the second PCB 12.

In particular, the parallel faces 131 may be spaced in excess of a largest component height of the power supply circuitry 121. This enables an arrangement of the power supply circuitry 121 within the gap between the first PCB 11 and the second PCB 12.

At least one of the spacers 13 may be screwed to the second PCB 12 via a threaded blind or through hole 132 extending perpendicularly to the parallel faces 131. In the example of FIG. 1, a rightmost spacer 13 shows an example of a threaded through hole 132, whereas all other spacers 13 comprise threaded blind holes 132.

Alternatively or additionally, at least one of the spacers 13 may be soldered to the first PCB 11 via one of the parallel faces 131. In the example of FIG. 1, this applies to all of the spacers 13 except for the rightmost spacer 13 mentioned above.

Every spacer 13 with single use case may be soldered to the first PCB 11. The spacers 13 with double use case for electrical power supply and mounting terminals 14 (see below) may be soldered or screwed to one another. The second PCB 11 may be screwed to the first PCB 11.

At least one of the spacers 13 may be at a ground electric potential. Thereby, the ground electric potential may be provided from the second PCB 12 to the first PCB 11, or in other words from the power supply circuitry 121 to the digital IC 111.

At least one of the spacers 13 may be at a ground-referenced electric potential corresponding to a nominal supply voltage of the digital IC 111. Thereby, the nominal supply voltage of the digital IC 111 may be provided from the second PCB 12 to the first PCB 11.

The power supply circuitry 121 may comprise a ground-referenced electric potential in excess of the nominal supply voltage of the digital IC 111. For example, the DC/DC converter mentioned above may be used to convert the higher supply voltage to the nominal supply voltage of the digital IC 111

Note that a secondary side of the second PCB 12 can be used for cooling. More specifically, the PCB arrangement 1 may further comprise a first heat sink, heat spreader or cold plate 122 being in thermodynamic communication with a component package of the power supply circuitry 121, wherein the power supply circuitry 121 is arranged on a surface of the second PCB 12 facing away from the first PCB 11. In the example of FIG. 1, an exemplary cold plate 122 is depicted, and a dotted block arrow indicates a heat transfer away from the power supply circuitry 121 via a thermal interface material (TIM) layer 123 and the cold plate 122. Alternatively, the second PCB 12 may also be flipped upside down to cool the component package of the power supply circuitry 121 by direct connection to any cooling interface.

The PCB arrangement 1 may further comprise a second heat sink, heat spreader or cold plate 112 being in thermodynamic communication with a component package of the digital IC 111, wherein the digital IC 111 is arranged on a surface of the first PCB 11 facing away from the second PCB 12. In the example of FIG. 1, an exemplary heat spreader 112 is depicted, and a dotted block arrow indicates a heat transfer away from the digital IC 111 via a TIM layer 115.

In mechanical support of the second heat sink, heat spreader or cold plate 112, the PCB arrangement 1 may further comprise a plurality of mounting terminals 14 for the same on the surface of the first PCB 11 facing away from the second PCB 12. Additional stiffeners 114 arranged on the package 113 of the digital IC 111 may further improve the mechanical support of the second heat sink, heat spreader or cold plate 112.

In particular, each of the mounting terminals 14 may comprise a pair of parallel faces 141 facing away from one another. This enables a parallel arrangement of the first PCB 11 and the second heat sink, heat spreader or cold plate 112.

At least one of the mounting terminals 14 may be screwed to the first PCB 11 via one of its parallel faces 141 in alignment with at least one of the spacers 13. In the example of FIG. 1, a rightmost mounting terminal 14 shows an example of a screw mounting via the threaded through hole 132 of the rightmost spacer 13.

Alternatively or additionally, at least one of the mounting terminals 14 may be soldered to the first PCB 11 via one of its parallel faces 141 in alignment with at least one of the spacers 13. In the example of FIG. 1, this applies to all of the mounting terminals 14 except for the rightmost mounting terminal 14 mentioned above.

Last but not least, a power management bus interface 15 may be provided for overall power management across the first and second PCBs 11, 12.

The invention claimed is:
1. A printed circuit board, PCB, arrangement, comprising
a first PCB, comprising
a digital integrated circuit, IC;
a second PCB, comprising
a power supply circuitry for the digital IC; and a plurality of electrically conductive spacers, being
  mechanically interposed between the first PCB and the second PCB, and
  electrically interposed between the power supply circuitry and the digital IC,
  wherein each of the spacers comprising a pair of parallel faces facing away from one another,
  the parallel faces being spaced in excess of a largest component height of the power supply circuitry, and
  the power supply circuitry is arranged within a gap between the first PCB and the second PCB.

2. The PCB arrangement of claim 1,
at least one of the spacers being screwed to the second PCB via a threaded blind or through hole extending perpendicularly to the parallel faces.

3. The PCB arrangement of claim 1,
at least one of the spacers being soldered to the first PCB via one of the parallel faces.

4. The PCB arrangement of claim 1,
at least one of the spacers being at a ground electric potential.

5. The PCB arrangement of claim 1,
at least one of the spacers being at a ground-referenced electric potential corresponding to a nominal supply voltage of the digital IC.

6. The PCB arrangement of claim 1,
the power supply circuitry comprising a ground-referenced electric potential in excess of the nominal supply voltage of the digital IC.

7. The PCB arrangement of claim 1, further comprising
a first heat sink, heat spreader or cold plate being in thermodynamic communication with a component package of the power supply circuitry, wherein the power supply circuitry is arranged on a surface of the second PCB facing away from the first PCB.

8. The PCB arrangement of claim 1, further comprising
a second heat sink, heat spreader or cold plate being in thermodynamic communication with a component package of the digital IC, wherein the digital IC is arranged on a surface of the first PCB facing away from the second PCB.

9. The PCB arrangement of claim 8, further comprising
a plurality of mounting terminals for the second heat sink, heat spreader or cold plate on the surface of the first PCB facing away from the second PCB.

10. The PCB arrangement of claim 9,
each of the mounting terminals comprising a pair of parallel faces facing away from one another.

11. The PCB arrangement of claim 10,
at least one of the mounting terminals being screwed to the first PCB via one of its parallel faces in alignment with at least one of the spacers.

12. The PCB arrangement of claim 10,
at least one of the mounting terminals being soldered to the first PCB via one of its parallel faces in alignment with at least one of the spacers.

13. The PCB arrangement of claim 1,
the digital IC comprising one or more of:
a field-programmable gate array, FPGA,
an application-specific integrated circuit, ASIC, and
a central processing unit, CPU.

* * * * *